United States Patent [19]

Yoshida

[11] Patent Number: 5,234,565
[45] Date of Patent: Aug. 10, 1993

[54] MICROWAVE PLASMA SOURCE

[75] Inventor: Yoshikazu Yoshida, Izumi, Japan

[73] Assignee: Matsushita Electric Industrial Co., Ltd., Osaka, Japan

[21] Appl. No.: 759,168

[22] Filed: Sep. 13, 1991

[30] Foreign Application Priority Data

Sep. 20, 1990 [JP] Japan .................................. 2-252403
Sep. 20, 1990 [JP] Japan .................................. 2-252404

[51] Int. Cl.$^5$ ............................................. C23C 14/00
[52] U.S. Cl. .......................... 204/298.38; 204/298.34; 204/298.37; 156/345; 118/723
[58] Field of Search .................. 156/345; 204/298.31, 204/298.33, 298.34, 298.37, 298.38; 315/111.21, 111.41, 111.71, 111.81; 250/423 R, 423 F; 118/719, 723

[56] References Cited

U.S. PATENT DOCUMENTS

| | | | |
|---|---|---|---|
| 4,339,326 | 7/1982 | Hirose et al. ................... | 204/298.38 |
| 4,563,240 | 1/1986 | Shibata et al. ............ | 204/298.38 X |
| 4,581,100 | 4/1986 | Hatzakis et al. ........... | 204/298.38 X |
| 4,761,219 | 8/1988 | Sasaki et al. .................... | 204/298.37 |
| 4,880,515 | 11/1989 | Yoshikawa et al. ........ | 204/298.19 X |
| 5,024,716 | 6/1991 | Sato ............................. | 204/298.38 X |

FOREIGN PATENT DOCUMENTS 56-13480 7/1979 Japan .
56-37311 7/1979 Japan .

OTHER PUBLICATIONS

Review of Scientific Instruments, Yoshikazu Yoshida, vol. 62, No. 6, Jun. 1991, "Plasma Properties In the Open-Ended Region of a Coaxial-Type Microwave Cavity", pp. 1498-1503.

*Primary Examiner*—Nam X. Nguyen
*Attorney, Agent, or Firm*—Wenderoth, Lind & Ponack

[57] ABSTRACT

A microwave plasma source includes: a microwave source for generating a microwave field; a rectangular cavity resonator have a glass container for passing the microwave field therethrough and for vacuum sealing; a vacuum chamber; a holder, and first and second circular permanent magnets. The coaxial tube is connected to the resonator, and has an outer conductor and an inner conductor having outer and inner door-knob-shaped portions at one ends thereof, respectively. The outer conductor has an opening at the end of the outer door-knob-shaped portion. The inner conductor is fitted into the resonator in parallel with a direction of an electric field in the resonator, and has a flat portion at the end of the inner door-knob-shaped portion. The container is fitted into the opening of the outer conductor so as to contact the inner conductor, and has an opening. The chamber is provided with an opening connected to with the opening of the container, a gas inlet port, and a gas exhaust port. The holder is arranged in the container while opposing the flat portion of the inner conductor, and holds a substance to be processed. The first circular permanent magnet is arranged at the flat portion of the inner conductor. The second circular permanent magnet is arranged at the holder so as to have a polarity opposite to that of the first permanent magnet.

17 Claims, 4 Drawing Sheets

MICROWAVE PLASMA SOURCE

BACKGROUND OF THE INVENTION

The present invention relates to a microwave plasma source which effects plasma etching and plasma oxidizing for semiconductor processing technology, surface treatment technology, etc.

Hereinbelow, a conventional magnetized microwave plasma etching apparatus (Japanese Patent Publication No. 56-37311) will be described.

FIG. 5 is a schematic diagram showing general construction of a conventional microwave plasma etching apparatus. Referring to FIG. 5, microwaves of a frequency of 2.45 GHz, generated by a magnetron 2, are is fed into a bell jar 1 made of quartz via a waveguide 3. In the bell jar 1, a magnetic field intensity of 875 G is applied to the microwave field of a frequency of 2.45 GHz by an external coil 4 so as to satisfy the ECR (Electron Cyclotron resonance) condition. As a reaction gas, $SF_6$ or the like is introduced into the bell jar 1 through a gas inlet port 5. Within the bell jar 1, there are provided a substrate holder 6 and a substrate 7 disposed thereon. The bell jar 1 is installed on an evacuation chamber 8.

With respect to a microwave plasma etching apparatus constituted as described above, the operation thereof will be described with reference to the accompanying drawings. Using $SF_6$ as a reaction gas, a plasma 9 is generated in the bell jar 1 within a pressure range of $10^{-4}$ to $10^{-3}$ Torr. In this case, a voltage RF (AC: 13.56 MHz), is applied to the substrate holder 6. Then, ions in the plasma 9 impinge on the surface of the silicon substrate 7 to achieve an etching due to an absorbed fluorine radical.

However, in the conventional microwave plasma source of such a construction, since a coil is employed to generate a magnetic field, the apparatus becomes bulky. Furthermore, there has been a disadvantage in that since part of the waveguide is used as a discharge domain, the sectional area and uniformity of the plasma are limited.

SUMMARY OF THE INVENTION

An object of the present invention is to provide a microwave plasma source which is arranged to reduce the size of the apparatus through the arrangement of a permanent magnet in the vicinity of the substrate, to enlarge the discharge zone through radiating microwaves from around the substrate by a coaxial tube whose end is door-knob shaped, and to effect control of uniformity by the magnetic field.

Accordingly, an object of the present invention is to provide a microwave plasma source which is capable of reducing the size through the use of a pair of large and small permanent magnets for generating the magnetic field, of enlarging the discharge domain through radiating microwaves from around the throttled magnetic field, and for generating a plasma of a high density through the employment of a PIG (Penning Ionization Gauge) discharge structure.

In accompanying these and other objects, according to one aspect of the present invention, there is provided a microwave plasma source comprising:

a microwave source for generating a microwave field;

a rectangular cavity resonator having the microwave source coupled thereto;

a coaxial tube connected with to the resonator, the coaxial tube having an outer conductor and an inner conductor having outer and inner door-knob-shaped portions at one ends thereof, respectively, the outer conductor having an opening at the end of the outer door-knob-shaped portion, the inner conductor being fitted into the resonator in parallel with a direction of an electric field in the resonator, and having a flat portion at the end of the inner door-knob-shaped portion;

a glass container for passing the microwave field therethrough and for vacuum sealing, the container being fitted into the opening of the outer conductor so as to contact the inner conductor, and having an opening;

a vacuum chamber provided with an opening connected to the opening of the container, a gas inlet port, and a gas exhaust port;

a holder arranged in the container while opposing the flat portion of the inner conductor, and holding a substance to be processed;

a first circular permanent magnet arranged at the flat portion of the inner conductor; and a second circular permanent magnet arranged at the holder so as to have a polarity opposite to that of the first permanent magnet.

According to the microwave plasma source of the present invention, the microwaves transmitted through the door-knob-shaped coaxial tube are radiated into the glass container fitted in the opening of the door-knob-shaped portion. Furthermore, owing to the action of the magnetic field formed by a pair of permanent magnets of opposite polarities which are arranged at the inner conductor and the holder, a magnetized microwave discharge takes place at a certain gas pressure. As a result, a plasma of a high density can be generated even at a low gas pressure.

According to another aspect of the present invention, there is provided a microwave plasma source comprising:

a microwave source for generating a microwave;

a rectangular cavity resonator having the microwave source coupled thereto;

a coaxial tube connected to the resonator, the coaxial tube having an outer conductor and an inner conductor having outer and inner door-knob-shaped portions at one ends thereof, respectively, each of the outer and inner door-knob-shaped portions having an opening at the ends of each of the door-knob-shaped portions, the inner conductor being fitted into the resonator in parallel with a direction of an electric field in the resonator, and having a flat portion at the end of the inner door-knob-shaped portion;

a glass plate for passing the microwave field therethrough and for vacuum sealing;

a vacuum chamber provided with an opening connected to the opening of the outer conductor, a gas inlet port, and a gas exhaust port;

a substrate holder arranged in the chamber while opposing the flat portion of the inner conductor, and holding a substance to be processed;

a first circular permanent magnet arranged at the flat portion of the inner conductor, and having an outer diameter of ⅓ to ⅔ of an inner diameter of the opening of the outer conductor; and a second circular permanent magnet arranged at the substrate holder so as to have a polarity opposite to that of the first permanent magnet, and having an outer diameter larger than that of the first circular permanent magnet.

According to the microwave plasma source of the present invention, the microwaves transmitted through the door-knob-shaped coaxial tube are radiated into the opening of the door-knob-shaped coaxial tube. In this case, by arranging the pair of permanent magnets arranged at the inner conductor and the substrate holder so as to have opposite poles, and so that the permanent magnet on the control member is larger in diameter than the permanent magnet on the inner conductor, it is possible to form a plasma of a large diameter.

According to another aspect of the present invention, there is provided a microwave plasma source comprising:

a microwave source for generating a microwave field;

a rectangular cavity resonator having the microwave source coupled thereto;

a coaxial tube connected to the resonator, the coaxial tube having an outer conductor and an inner conductor having door-knob-shaped thereof, respectively, each of the outer and inner conductors having an opening at the ends of the door-knob-shaped portions, the inner conductor being fitted into the resonator in parallel with a direction of an electric field in the resonator, and having a flat portion at the end of the door-knob-shaped portion, the inner conductor having a T-shaped tip end and the tip end projecting from a side face of the resonator in a direction perpendicular to a forward direction of the microwave field in the resonator;

a glass plate for passing the microwave field therethrough and for vacuum sealing;

a vacuum chamber provided with an opening connected to the opening of the outer conductor, a gas inlet port, and a gas exhaust port;

a substrate holder arranged in the chamber while opposing the flat portion of the inner conductor, and holding a substance to be processed;

a first circular permanent magnet arranged at the flat portion of the inner conductor, and having an outer diameter of $\frac{1}{3}$ to $\frac{2}{3}$ of an inner diameter of the opening of the outer conductor;

a second circular permanent magnet arranged at the substrate holder so as to have a polarity opposite to that of the first permanent magnet, and having an outer diameter larger than that of the first circular permanent magnet;

a first electrode installed on the flat portion of the inner conductor; and a means for applying a negative electric potential to the electrode and the substrate holder.

Furthermore, by installing an electrode on the opening portion of the inner conductor, and through applying a negative electric potential to the electrode and the control member, a PIG (Penning Ionization Gauge) discharge takes place. As a result, it is possible to generate plasma of a large diameter and a high density even under a low gas pressure.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
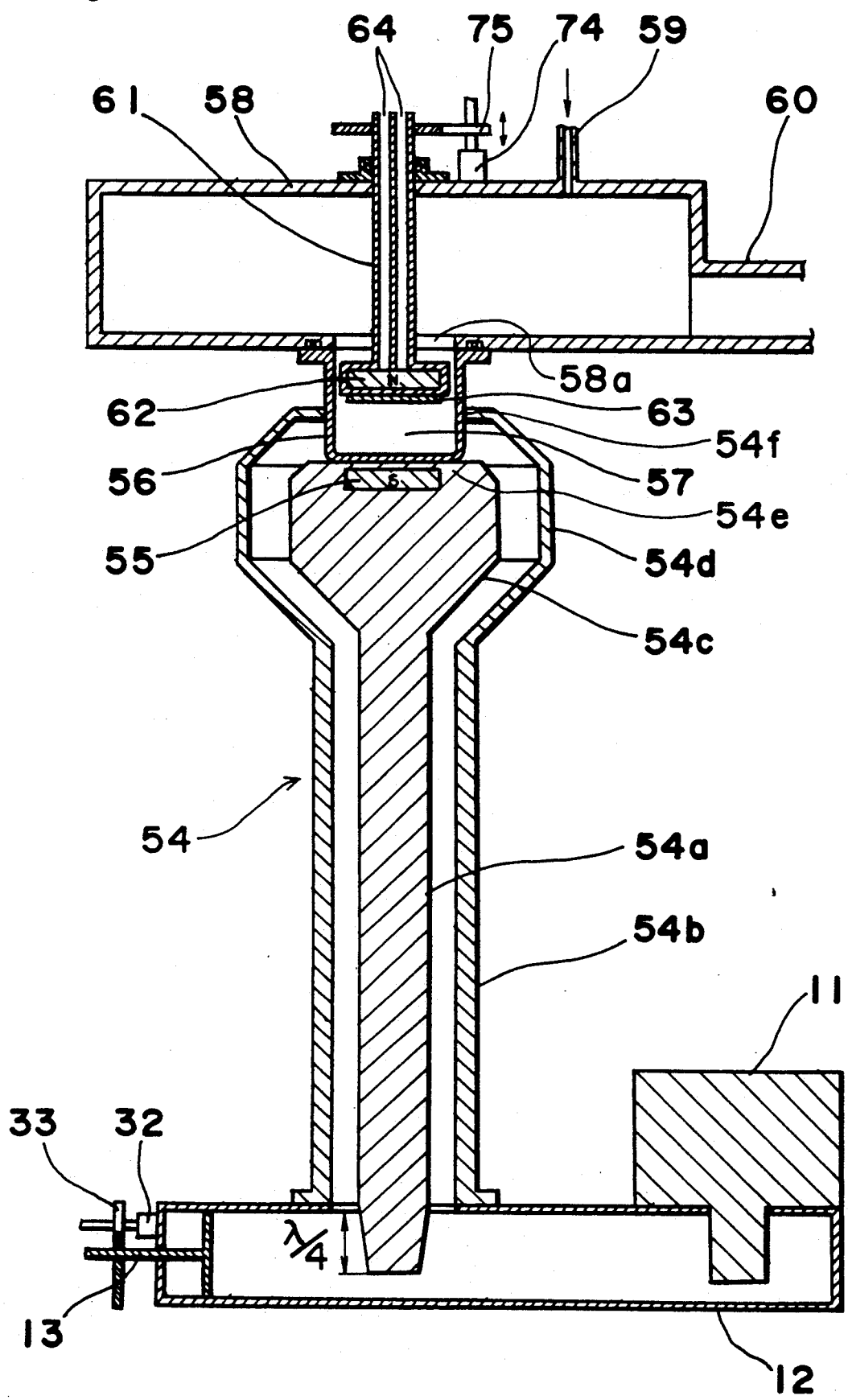
FIG. 1 is a front sectional view of a microwave plasma source according to one preferred embodiment of the present invention.

Before the description of the present invention proceeds, it is to be noted that like parts are designated by like reference numerals throughout the accompanying drawings.

Hereinbelow, a microwave plasma source according to one preferred embodiment of the present invention will be described with reference to the accompanying drawings.

In FIG. 1, microwaves of a frequency of, for example, 2.45 GHz generated by a magnetron 11, are fed to a rectangular cavity resonator 12. On one end of the cavity resonator 12, there is provided a movable short-circuiting plate 13 so as to guide microwaves to a coaxial tube 54. The coaxial tube 54 is constituted by a cylindrical outer conductor 54b and a columnar inner conductor 54a which is coaxial with the outer conductor 54b. The inner conductor 54a is projected within the rectangular cavity resonator 12 by $\frac{1}{4}$ of the microwave wavelength $\lambda$ (for example, $\lambda = 12.4$ cm) in parallel with the direction of the electric field in the resonator 12, with a taper of 10° being given on that portion. The other end of the coaxial tube 54, that is, each of the other end portions 54c and 54d of the inner and outer conductors 54a and 54b is formed in a door-knob shape. The other end portion 54c of the inner conductor 54a is extended from the other end, i.e., the upper end of the inner conductor 54a while gradually enlarging the diameter thereof. That is, the outer shape of the other end portion 54c is formed by combining circular truncated cone shape, of which the inclined angle of the cross-sectional shape is 45 degree, and cylinder shape so that plasma of a desired size may be obtained at its open end. The inner conductor 54a has a flat portion 54e at the end in which a first circular disk-shaped permanent magnet 55 is buried. A bell-shaped glass container 56 of 5 mm thickness is closely fitted into an opening 54f of the outer conductor 54b and disposed on the flat portion 54e of the inner conductor 54a. The opening of the container 56 is closely connected to the opening 58a of a vacuum chamber 58. The container 56 is installed on the chamber 58 which is provided with a gas inlet port 59 and a gas exhaust port 60. Then, the insides of the chamber 58 and the container 56 can be kept in the vacuum state. Through the upper wall of the chamber 58 and within the container 56, there is provided a sample holder 61 which is installed on the chamber 58 so as to be movable up and down by a driving cylinder 74 serving as a moving device. The upper end of the holder 61 is connected to a plate 75 capable of moving up and down with respect to the chamber 58 by the driving cylinder 74. A second circular disk-shaped permanent magnet 62 is buried in the lower end of the holder 61 and a substrate 63 can be installed thereon. The first and second permanent magnets 55 and 62 are arranged to be in opposite polarities with each other, with the substrate 63 being placed therebetween. Preferably, the distance between the first and second circular permanent magnets 55 and 62 is of 20 mm to 80 mm, and intensity of magnetic field formed by the first and second circular permanent magnets 55 and 62 at a central portion thereof is 0.1 to 1.0 Kilo Gauss. The holder 61 contains a cooling water piping 64 so that the substrate 63 may be cooled. By moving the holder 61 with the driving cylinder 74, the distance between the lower surface of the second permanent magnet 62 and the upper surface of the first permanent magnet 55 is changed so that the magnetic field intensity at its center can be varied from 100 to 1000 Gauss.

In such a structure, the microwave field of a frequency of 2.45 GHz generated by the magnetron 11, is transmitted through the rectangular cavity resonator 12 of, a cross-section of for example, 109 mm×54.5 mm. Its impedance is changed in accordance with the change of the position of the movable short-circuiting plate 13, and then the microwaves are fed to the coaxial tube 54 of, for example, 18 mm inner diameter and 42 mm outer diameter, from the resonator 12 so as to be radiated into the inside of the container 58 through the space between the inner and outer conductors 54a and 54b and the other end portions 54c and 54d thereof. In this case, when oxygen gas or the like is introduced from the gas inlet port 59, and the gas pressure within the chamber 58 is set to $2 \times 10^{-2}$ Torr an, electric discharge is started. Furthermore, by properly changing the position of the movable short-circuiting plate 13 by moving a plate 33 connected to the plate 13 by a driving cylinder 32, the reflected wave of the microwave field is minimized. At this time point, when the central magnetic field between the first and second permanent magnets 55 and 62 is set to be 875 Gauss, a microwave ECR discharge takes place, and an oxygen plasma of a high density can be generated even at a pressure of $10^{-4}$ Torr range. Accordingly, for example, removal processing of matters on the silicon substrate 63, oxidization, etc. can be effected at a high speed.

In the above construction, the movable short-circuiting plate 13 may be moved manually. The container 56 may be formed with a U-shape or V-shape cross-section to contact the lower end point of the container with the flat portion 54e of the other end 54c of the inner conductor 54a. The coaxial tube 54 may be fixed to the chamber 58 through the container 56. Alternatively, the tube 54 has a T-shaped lower end formed at the lower end of the tube 54 as shown in FIG. 3 and the T-shaped lower end is fixed to the sides of the resonator 12.

According to the microwave plasma source according to the embodiment of the present invention, through fitting the glass container into the opening of the coaxial tube so as to radiate microwaves therein, and through the action of the first and second permanent magnets buried in the inner conductor and the sample holder, respectively, a magnetized microwave discharge becomes, possible at a pressure of $10^{-4}$ Torr range, and thus, a uniform and high density reactive plasma can be generated. Accordingly, the etching of silicon, etc. and the oxidization thereof can be effected at a high speed even at a low gas pressure.

Figure 2:
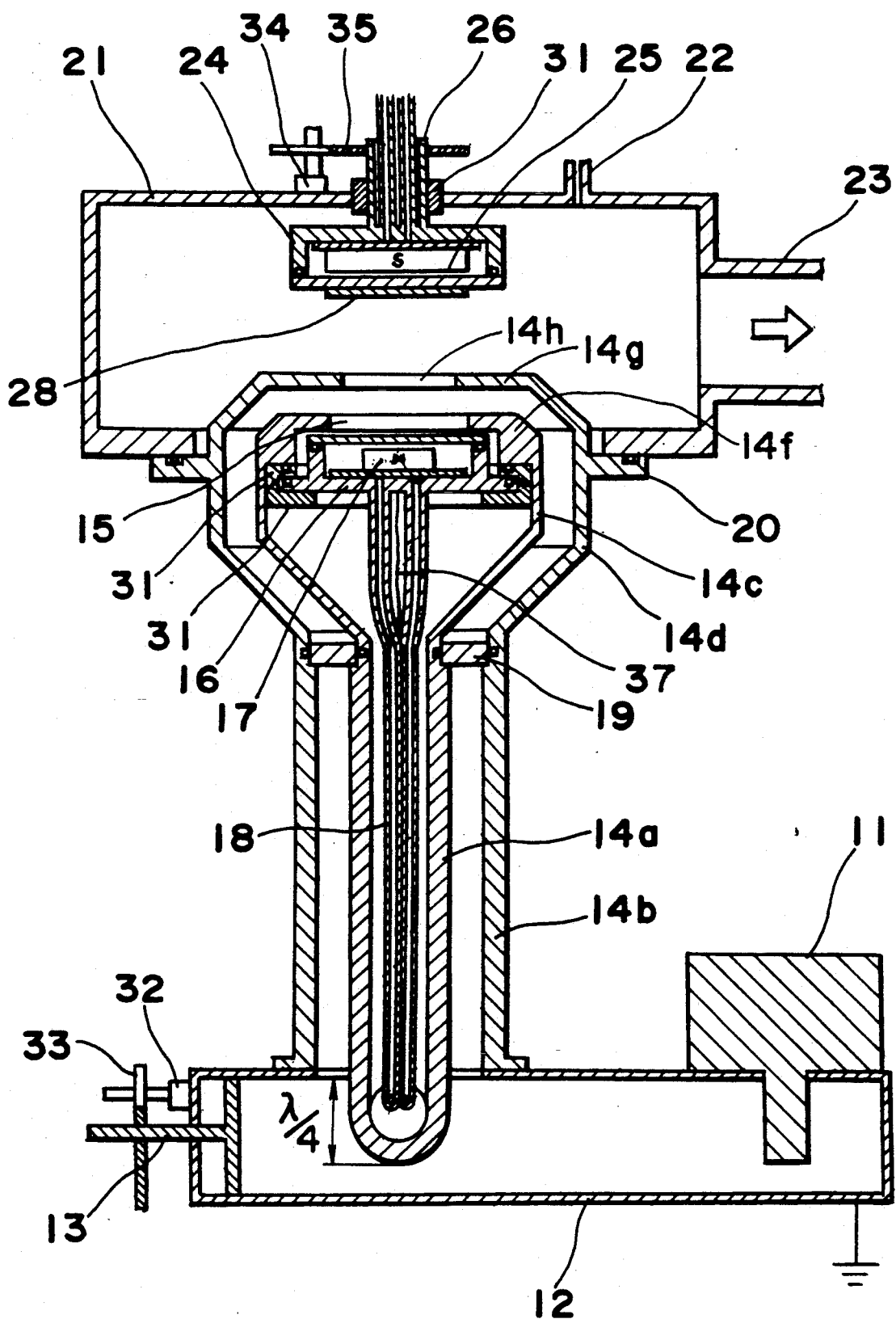
FIG. 2 is a front sectional view of a microwave plasma source according to another preferred embodiment of the present invention.
Figure 3:
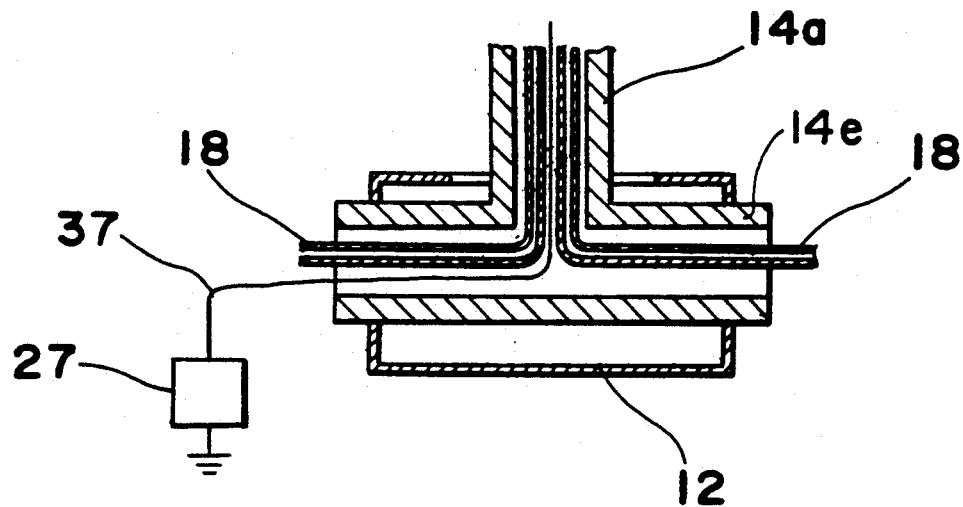
FIG. 3 is a side sectional view of the microwave plasma source as shown in FIG. 2.
Figure 4:
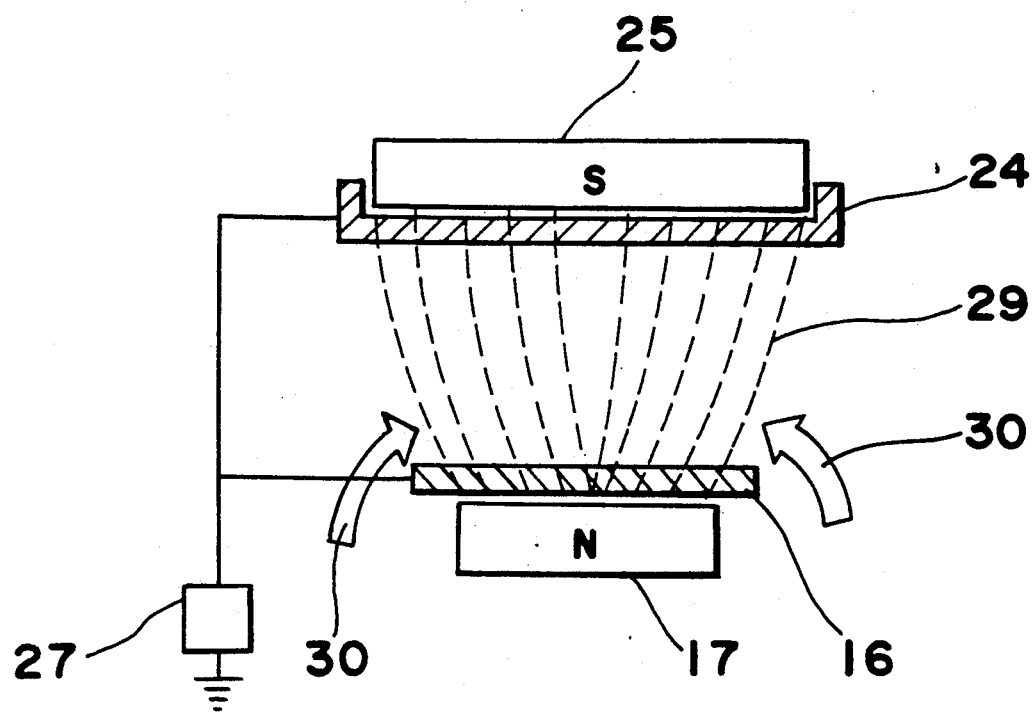
FIG. 4 is a drawing for explaining the operation of the microwave plasma source as shown in FIG. 2.
Figure 5:
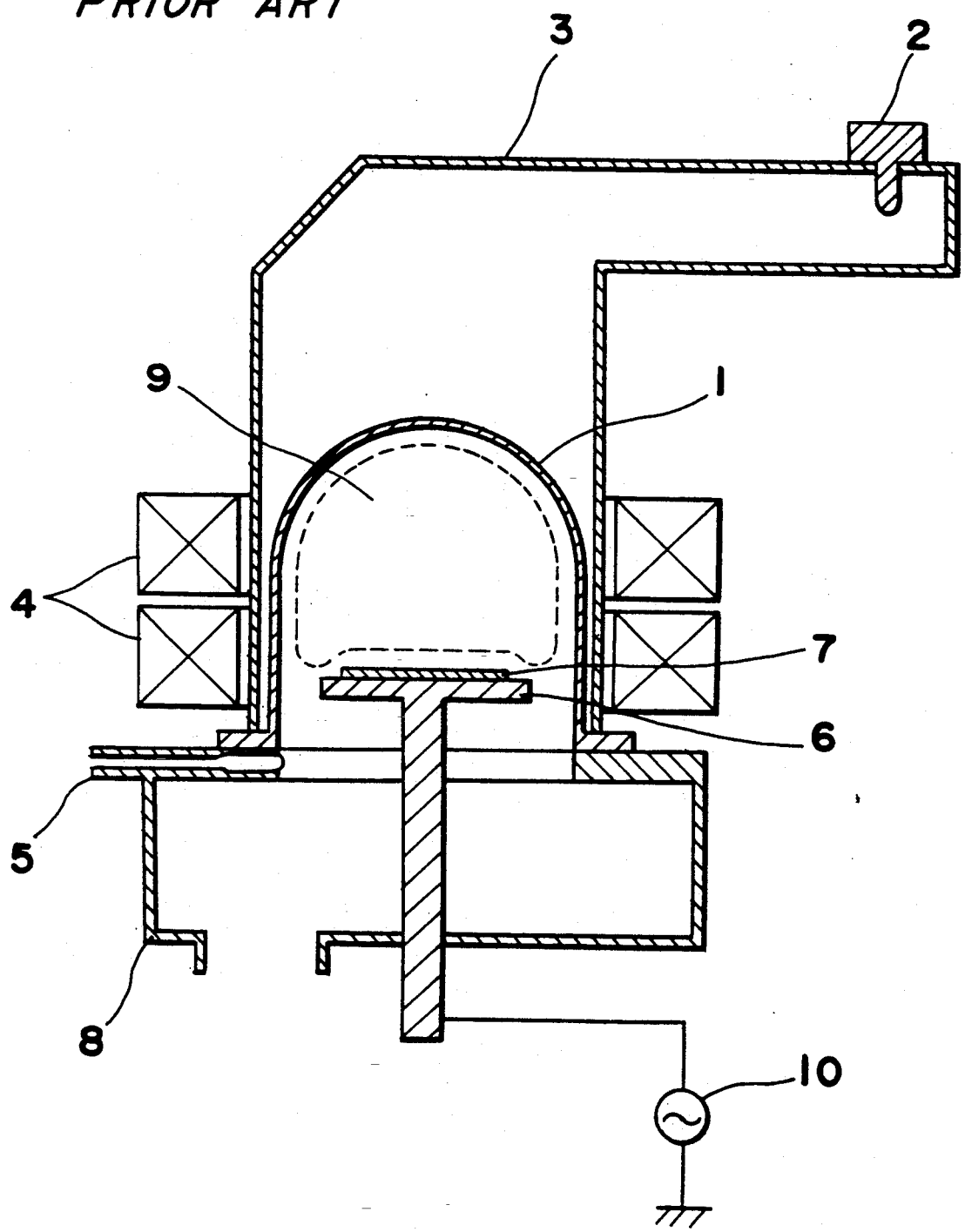
FIG. 5 is a sectional view of a conventional microwave plasma source.

FIGS. 2–4 show a microwave plasma source according to a second embodiment of the present invention. In FIG. 2, microwaves of a frequency of, for example, 2.45 GHz, generated by the magnetron 11, and fed to the rectangular cavity resonator 12, which has the movable short-circuiting plate 13 on one end thereof so as to guide the microwaves to a coaxial tube 14. The movable short-circuiting plate 13 can be moved by moving a plate 33 connected to the plate 13 by a driving cylinder 32. The coaxial tube 14 is constituted by a cylindrical outer conductor 14b and a cylindrical inner conductor 14a which is coaxial with the central axis of the outer conductor 14b. The inner conductor 14a is inserted into the rectangular cavity resonator 12 by a length of ¼ wavelength λ (for example, λ=12.4 cm) in the direction of the electrical field in the resonator 12, with its T-shaped tip end 14e being penetrated on the side faces of the cavity resonator 12, as shown in FIG. 3. The T-shaped tip end 14e extends in a direction perpendicular to a forward direction of the microwave. Through the T-shaped tip end 14e, a power supply line 37 and the water cooling piping 18 both connected to an electrically insulated electrode 16 are fed outside the coaxial tube 14. The other end of the coaxial tube 14, that is, each of the other end portions 14c and 14d of the inner and outer conductors 14a and 14b is formed in a doorknob shape. The other end portion 14c of the inner conductor 14a is extended from the other end, i.e., the upper end of the inner conductor 14a while gradually enlarging the diameter thereof. That is, the outer shape of the other end portion 14c is formed by combining a circular truncated cone shape, of which the inclined angle of the cross-sectional shape is 45 degree, and a cylindrical shape so that plasma of a desired size may be obtained at its open end. The inner and outer conductors 14a and 14b each have flat portions 14f and 14g at the ends thereof. In the flat portion 14f, the electrically insulated electrode 16 and a first circular disk-shaped permanent magnet 17 are disposed. The first circular permanent magnet 17 has an outer diameter of ⅓ to ⅔ of an inner diameter of the opening 14h of the outer conductor 14b. So that the electrode 16 and the first permanent magnet 17 may be water-cooled, a water cooling piping 18 is provided within the inner conductor 14a. The electrode 16 is electrically insulated from the inner conductor 14a through insulators 31. Between the inner conductor 14a and the outer conductor 14b, a glass annular plate 19 for vacuum sealing is provided on the root portion of the inclined portion. A flange 20 is provided on the periphery of the other end portion 14d of the outer conductor 14b for installing the coaxial tube 14 on a vacuum chamber 21. The vacuum chamber 21 is provided with a gas inlet port 22 and a gas exhaust port 23. Straight above the opening 15 of the other end portion 14c of the inner conductor 14a through the opening 14h of the outer conductor 14b, there is provided a plasma control plate 24 which is mounted on the vacuum chamber 21 so as to be electrically insulated through an insulator 31 and movable up and down by a driving cylinder 34. The control plate 24 is of electrically material and the control plate 24 and the electrode 16 are electrically connected to a power source 27 by the power supply line 37 as shown in FIG. 4. The control plate 24 is connected to a plate 35 movable up and down by the driving cylinder 34. On the control plate 24, there is buried a second circular disk-shaped permanent magnet 25 which is arranged to be opposite in polarity to the first permanent magnet 17 in polarity. The second circular permanent magnet 25 has an outer diameter larger than that of the first circular permanent magnet 17. Preferably, the distance between the first and second circular permanent magnets 17 and 25 is of 20 mm to 80 mm, and the intensity of magnetic field formed by the first and second circular permanent magnets 17 and 25 at a central portion thereof is 0.1 to 2.0 Kilo Gauss. A water cooling piping 26 is incorporated in the control plate 24 so as to cool the second permanent magnet 25. By moving the control plate 24 by the driving cylinder 34 with respect to the insulator 31 and the chamber 21, the distance between the lower surface of the second permanent magnet 25 and the upper surface of the first permanent magnet 17 is changed so that the magnetic field intensity can be varied from 100 Gauss to 2000 Gauss.

In such a construction, microwaves of a frequency of 2.45 GHz, generated by the magnetron 11 are is transmitted through the cavity resonator 12 of a cross-section of 109 mm $\times$ 54.5 mm, and by changing the position of the movable short-circuiting plate 13. By changing the impedance, the microwave field is fed to the coaxial tube 14 of, for example, 18 mm inner diameter and 42 mm outer diameter so as to be radiated into the opening 15 of, for example, 100 mm diameter via the glass annular plate 19. In this case, when oxygen, etc. is introduced through the gas inlet port 22 and the gas pressure in the chamber 21 is reduced to $2 \times 10^{-2}$ Torr, the electric discharging is started. Furthermore, by properly changing the position of the movable short-circuiting plate 13 by the driving cylinder 32, the reflected wave of the microwave field is minimized. In this case, when the diameter of the first permanent magnet 17 in the other end portion 14c of the inner conductor 14a is, for example, 48 mm, and the diameter of the second permanent magnet 25 in the control plate 24 is at, for example, at 90 mm, and further, the field intensity near center of the pole is 8.75 Gauss, the microwave ECR discharge takes place, and an oxygen plasma of a high density can be generated even under a pressure of $10^{-4}$ Torr. As shown in FIG. 4, when 200 V is applied to the electrode 16 and the control plate 24 from the power source 27, electrons are confined between the magnetic poles as shown in FIG. 3, and thus, a plasma of a high density can be obtained. In this case, since microwaves 30 are incident from the throttled portion, of the magnetic fluxes 29, a uniform plasma between the magnetic poles is generated. For example, when a silicon substrate 28 is installed on the control plate 24, etching, oxidization, etc. can be effected at a high speed.

According to the microwave plasma source according to the second embodiment of the present invention, when the open end diameter is 70 mm, the distance between electrodes is 50 mm ($-100$ V), the central magnetic field intensity is 1 Kilo Gauss, and argon gas pressure is $1 \times 10^{-3}$ Torr, a columnar plasma of 120 mm diameter at its center and $10^{10}$/cm$^3$ can be generated, and by this microwave plasma source, etching and oxidization of silicon, etc. can be effected at a high speed.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A microwave plasma source comprising:
   a microwave source for generating a microwave field;
   a rectangular cavity resonator having the microwave source coupled thereto;
   a coaxial tube connected to the resonator, the coaxial tube having an outer conductor and an inner conductor having outer and inner door-knob-shaped portions at one ends thereof, respectively; the outer conductor having an opening at the end of the outer door-knob-shaped portion; the inner conductor being fitted into the resonator in parallel with a direction of an electric field in the resonator, and having a flat portion at the end of the inner door-knob-shaped portion;
   a glass container for passing the microwave field therethrough and for vacuum sealing, the container being fitted into the opening of the outer conductor so as to contact the inner conductor, and having an opening;
   a vacuum chamber provided with an opening connected to the opening of the container, a gas inlet port, and a gas exhaust port;
   a holder arranged in the container while opposing the flat portion of the inner conductor, and holding a substance to be processed;
   a first circular permanent magnet arranged at the flat portion of the inner conductor; and
   a second circular permanent magnet arranged at the holder so as to have a polarity opposite to that of the first permanent magnet.

2. The microwave plasma source as claimed in claim 1, wherein the cavity resonator is provided with a movable short-circuiting plate.

3. The microwave plasma source as claimed in claim 1, wherein the outer and inner conductors are respectively expanded at 45° inclination at roots of the outer and inner door-knob-shaped portions.

4. The microwave plasma source as claimed in claim 1, wherein the holder has a moving device for moving the holder with respect to the first circular permanent magnet to change distance between the first and second circular permanent magnets.

5. The microwave plasma source as claimed in claim 4, wherein the distance between the first and second magnets is in a range of 20 mm to 80 mm, and a magnetic field intensity formed by the first and second circular permanent magnets at a central portion thereof is in a range of 0.1 to 1.0 Kilo Gauss.

6. The microwave plasma source as claimed in claim 1, wherein the microwave field is of a frequency of 2.45 GHz.

7. The microwave plasma source as claimed in claim 1, wherein the inner conductor is inserted into the resonator by a length equal to $\frac{1}{4}$ of a wavelength of the microwave field.

8. A microwave plasma source comprising:
   a microwave source for generating a microwave field;
   a rectangular cavity resonator having the microwave source coupled thereto;
   a coaxial tube connected to the resonator, the coaxial tube having an outer conductor and an inner conductor having outer and inner door-knob-shaped portions at one ends thereof, respectively; each of the outer and inner door-knob-shaped portions having an opening at the ends of each of the door-knob shaped portions; the inner conductor being fitted into the resonator in parallel with a direction of an electric field in the resonator, and having a flat portion at the end of the inner door-knob-shaped portion;

a glass plate for passing the microwave field therethrough and for vacuum sealing;

a vacuum chamber provided with an opening connected to the opening of the outer conductor, a gas inlet port, and a gas exhaust port;

a substrate holder arranged in the chamber while opposing the flat portion of the inner conductor, and holding a substance to be processed;

a first circular permanent magnet arranged at the flat portion of the inner conductor, and having an outer diameter of ⅛ to ⅜ of an inner diameter of the opening of the outer conductor; and a second circular permanent magnet arranged at said substrate holder so as to have a polarity opposite to that of the first permanent magnet, and having an outer diameter larger than that of the first circular permanent magnet.

9. The microwave plasma source as claimed in claim 8, wherein the resonator is provided with a movable short-circuiting plate.

10. The microwave plasma source as claimed in claim 8, wherein the outer and inner conductors are respectively extended at 45° inclination at roots of the outer and inner door-knob-shaped portions.

11. The microwave plasma source as claimed in claim 8, wherein said substrate holder has a moving device for moving it with respect to the first circular permanent magnet to change a distance between the first and second circular permanent magnets.

12. The microwave plasma source as claimed in claim 11, wherein the distance between the first and second magnets is in a range of 20 mm to 80 mm, and a magnetic field intensity formed by the first and second circular permanent magnets at a central portion thereof is in a range of 0.1 to 2.0 Kilo Gauss.

13. The microwave plasma source as claimed in claim 8, wherein the microwave field is of a frequency of 2.45 GHz.

14. The microwave plasma source as claimed in claim 8, wherein the inner conductor inserted into the resonator has a T-shaped tip end and the tip end projects from a side face of the resonator in a direction perpendicular to a forward direction of the microwave field in the resonator.

15. A microwave plasma source comprising:

a microwave source for generating a microwave;

a rectangular cavity resonator having the microwave source coupled thereto;

a coaxial tube connected to the resonator, the coaxial tube having an outer conductor and an inner conductor having door-knob-shaped portions at one ends thereof, respectively; each of the outer and inner conductors having an opening at the ends of the door-knob-shaped portions; the inner conductor being fitted into the resonator in parallel with a direction of an electric field in the resonator, and having a flat portion at the end of the inner door-knob-shaped portion; the inner conductor having a T-shaped tip end and the tip end projecting from a side face of the resonator in a direction perpendicular to a forward direction of the microwave field in the resonator;

a glass plate for passing the microwave field therethrough and for vacuum sealing;

a vacuum chamber provided with an opening connected to the opening of the outer conductor, a gas inlet port, and a gas exhaust port;

a substrate holder arranged in the chamber while opposing the flat portion of the inner conductor, and holding a substance to be processed;

a first circular permanent magnet arranged at the flat portion of the inner conductor, and having an outer diameter of ⅛ to ⅜ of an inner diameter of the opening of the outer conductor;

a second circular permanent magnet arranged at said substrate holder so as to have a polarity opposite to that of the first permanent magnet, and having an outer diameter larger than that of the first circular permanent magnet;

a first electrode installed on the flat portion of the inner conductor; and a means for applying a negative electric potential to the electrode and the substrate holder.

16. A microwave plasma source comprising:

a microwave source for generating a microwave field;

a rectangular cavity resonator having the microwave source coupled thereto;

a coaxial tube connected to the resonator, the coaxial tube having an outer conductor and an inner conductor having an outer and inner door-knob-shaped portions at one ends thereof, respectively; each of the outer and inner conductors having an opening at the ends of the door-knob-shaped portions, the inner conductor being fitted into the resonator in parallel with a direction of an electric field in the resonator, and having a flat portion at the end of the inner door-knob-shaped portion;

a glass plate for passing the microwave field therethrough and for vacuum sealing;

a vacuum chamber provided with an opening connected to the opening of the outer conductor, a gas inlet port, and a gas exhaust port;

a substrate holder arranged in the chamber while opposing the flat portion of the inner conductor, and holding a substance to be processed;

a first circular permanent magnet arranged at the flat portion of the inner conductor, and having an outer diameter of ⅛ to ⅜ of an inner diameter of the opening of the outer conductor;

a second circular permanent magnet arranged at said substrate holder so as to have a polarity opposite to that of the first permanent magnet, and having an outer diameter larger than that of the first circular permanent magnet;

an electrode installed on the flat portion of the inner conductor; and a means for applying a negative electric potential to the electrode and said substrate holder.

17. The microwave plasma source as claimed in claim 16, wherein the inner conductor is hollow and having a power supply line for supplying power to the electrode and a cooling water piping therein.

* * * * *